(12) United States Patent
Tsuchiya et al.

(10) Patent No.: US 6,585,909 B2
(45) Date of Patent: Jul. 1, 2003

(54) METHOD OF MANUFACTURING OXIDE THIN FILM FOR BOLOMETER

(75) Inventors: Tetsuo Tsuchiya, Ibaraki (JP); Susumu Mizuta, Ibaraki (JP); Toshiya Kumagai, Ibaraki (JP); Tsutomu Yoshitake, Tokyo (JP); Yuichi Shimakawa, Tokyo (JP); Yoshimi Kubo, Tokyo (JP)

(73) Assignees: National Institute of Advanced Industrial Science & Technology, Tokyo (JP); NEC Corporation, Tokyo (JP)

( * ) Notice: Subject to any disclaimer, the term of this patent is extended or adjusted under 35 U.S.C. 154(b) by 62 days.

(21) Appl. No.: 09/984,846

(22) Filed: Oct. 31, 2001

(65) Prior Publication Data

US 2002/0139776 A1 Oct. 3, 2002

(30) Foreign Application Priority Data

Mar. 27, 2001 (JP) .................. 2001-089149

(51) Int. Cl.$^7$ ................. H01L 21/00; B44C 1/22; C23F 1/00
(52) U.S. Cl. .............. 216/86; 216/16; 216/52; 216/65; 216/61; 438/707
(58) Field of Search ............ 216/13, 16, 41, 216/52, 65, 86, 61; 438/10, 17, 707, 708, 720, 742

(56) References Cited

U.S. PATENT DOCUMENTS 4,665,008 A * 5/1987 Nishiura et al. ........ 438/754 X
5,368,687 A * 11/1994 Sandhu et al. .............. 438/710

FOREIGN PATENT DOCUMENTS

| JP | 11-271145 A | 10/1999 |
|---|---|---|
| JP | 2000-95522 A | 4/2000 |
| JP | 2000-143243 A | 5/2000 |

OTHER PUBLICATIONS

T. Obata et al., "Tunneling magnetoresistance at up to 270 K in $La_{0.8}Sr_{0.2}MnO_3/SrTiO_3/La_{0.8}Sr_{0.2}MnO_3$ junctions with 1.6–nm–thick barriers", Applied Physics Letters, vol. 74, No. 2, (Jan. 11, 1999), pp. 290–292.

* cited by examiner

Primary Examiner—William A. Powell
(74) Attorney, Agent, or Firm—Sughrue Mion, PLLC

(57) ABSTRACT

An oxide for use in a bolometer with an oxide thin-film formed is manufactured on an insulating substrate. Metal organic compound is dissolved in solvent to form solution during manufacturing the oxide thin-film. The solution is applied on the insulating substrate, and the applied solution is dried. A bond between carbon and oxygen is cut and decomposed by irradiating a laser ray with wavelength of 400 nm or less. A generated oxide is crystallized.

26 Claims, 2 Drawing Sheets

METHOD OF MANUFACTURING OXIDE THIN FILM FOR BOLOMETER

BACKGROUND OF THE INVENTION

This invention broadly relates to a method for manufacturing an oxide thin-film for use in a bolometer and to a non-cooling type infrared ray sensor using the oxide film.

A bolometer utilizes temperature variation of electrical resistance of a metal film or a semiconductor film which is thermally insulated from a substrate material. A temperature coefficient of electrical resistance (TCR) and electrical resistance value are exemplified as characteristics required for materials for the bolometer.

In general, as the electrical resistance value of the material for the bolometer becomes higher, Johnson noise also becomes higher. This phenomenon is not preferable.

On the other hand, when the electrical resistance becomes low, a difference between wiring resistance other than the bolometer and an electrical resistance value of the material for the bolometer becomes small. This phenomenon is not desirable also.

In consideration of the above, it is desirable that the electrical resistance value of the material for the bolometer falls within the range between 5 and 100 K$\Omega$ at the room temperature.

In other words, if a resistive element thin-film for the bolometer has a thickness within the range between 50 and 1,000 nm, electrical resistivity required for the material for the bolometer desirably falls within the range between about 0.025 and 10 $\Omega$cm.

In addition, temperature resolution of an infrared ray sensor (NETD) is inversely proportional to a TCR absolute value of the material for the bolometer. Accordingly, the infrared sensor having lower NETD can be obtained by using the material for the bolometer with a higher TCR absolute value.

Generally, an alloy thin-film such as a nickel iron alloy has TCR of about 0.5%/K, and as a result, it is not preferable for the bolometer material of the infrared rays sensor with high sensitivity.

In contrast, a vanadium oxide thin-film has a relatively high TCR of about 2%/K as disclosed in Japanese Unexamined Patent Publication (JP-A) No. Hei. 11-271145. Consequently, it is generally used for the material of the bolometer.

Alternatively, a part of vanadium V is attempted to be replaced by the other element such as manganese Mn disclosed in Japanese Unexamined Patent Publication (JP-A) No. 2000-143243. In consequence, it has been reported that the TCR absolute value can be increased up to about 4%/K.

However, the material having higher TCR for the bolometer must be developed in order to achieve further higher sensitivity or multiple pixels of the infrared ray sensor.

To achieve such a purpose, suggestion has been made about use of a provskite type Mn oxide represented by $La_1-x$ $Srx$ $MnO_3$, $La1-x$ $Cax$ $MnO_3$, $Pr_1-x$ $Srx$ $MnO_3$ as the material for the bolometer.

This technique utilizes such phenomenon that the perovskite type Mn oxide has high TCR within a semiconductor region, thus obtaining a value of about 3%/K as the TCR absolute value.

However, this value is not particularly high compared to such case that a part of vanadium oxide base is replaced by Mn. To this end, the infrared rays sensor utilizing the characteristic of the semiconductor region of the perovskite type Mn oxide does not has a specific advantage in comparison with the infrared ray sensor using the conventional vanadium oxide based material.

In contrast, another attempt has been made about use of the other characteristics of the above perovskite type Mn oxide for the infrared ray sensor, as disclosed Japanese Unexamined Patent Publication (JP-A) No. 2000-95522.

The above perovskite type Mn oxide has a unique characteristic indicative of phase transition between an insulator and a metal. In such phase transition, the provskite type Mn oxide transfers from an insulating state of high temperature into a metal state of low temperature in accordance with variation of magnetic property.

Under this circumstance, the temperature, at which the transition between the insulator and the metal occurs, can be set near the room temperature by adjusting Sr composition x in the above $La_1-x$ $Srx$ $MnO_3$.

In this case, the electrical resistance is largely varied in the transition between the insulator and the metal, thus obtaining higher TCR. By employing such characteristic, it is expected that the infrared ray sensor with higher sensitivity can be realized compared to the conventional sensor. In practical, it has been reported that the material has excessively high TCR of 5% K or more, particularly exceeding 10%/k.

Thus, the infrared ray sensor can have high sensitivity or multiple pixels by utilizing the perovskite type Mn oxide as the material for bolometer. However, a sol-gel method is used during producing the perovskite type Mn oxide thin-film in the aforementioned JP-A No. 2000-95522.

As described in the above Patent Publication, for example, each coating agent for octane based MOD method (organic metal deposition) of La, Sr, Mn is mixed with a desired ratio, is applied on an oxide substrate, is dried, and then is annealed for crystallization at a high temperature.

In this event, it is necessary to anneal at high temperature of approximately 1000° C. in order to realize an excellent transition between the insulator and metal in the perovskite type Mn oxide thin-film.

As the other methods, use is made of a deposition method such as a laser ablation method or a sputtering method. For example, as described in applied physics letters (Appl. Phys. Lett.) 74 volume. 290 page, 1999, high deposition temperature of 700° C. or more is required so as to obtain the excellent transition between the insulator and the metal even when these deposition methods will be used.

As discussed above, high TCR exceeding 5%/K can be obtained by utilizing the transition between the insulator and the metal inherent to the perovskite type oxide. Consequently, it is expected that the non-cooling type infrared ray sensor with higher sensitivity than the conventional case can be realized by using the perovskite type Mn oxide as the material for the bolometer.

Generally, a receiving portion of the non-cooling type infrared ray sensor is formed on a Si substrate. Further, a signal read-out circuit is arranged in the Si substrate under the receiving portion. On the other hand, the resistive element for the bolometer is formed on a bridge structure body placed on the Si substrate via a thermal insulating gap.

Specifically, the resistive element for the bolometer is formed on the Si substrate having the signal read-out circuit. To this end, the material for the bolometer must have consistency with a Si production process in addition to the high TCR.

From viewpoint of the consistency with the Si production process, it is required that deposition temperature is low at 400–500° C. or less and that a physical etching method such as ion-milling can not be utilized during forming the pattern of the resistive element for the bolometer. This is because the physical etching gives damage for the signal read-out circuit of Si formed on an under layer.

Considering such a problem with respect to the production process, the perovskite type Mn oxide thin-film has important disadvantages as the material for the bolometer.

First, as described above, the high deposition temperature is necessary in order to increase TCR with this material, namely, to obtain the excellent transition between the insulator and the metal. More specifically, the temperature of about 1000° C. is necessary in the case of the sol-gel method while the temperature of 700° C. or higher is required in the sputtering method.

As long as the high deposition temperature is required, it is difficult to apply the attractive material having high TCR to the Si production process.

Practically, the thin-film is merely formed on $SrTiO_3$ (100) resistant to high deposition temperature, namely, on an oxide single crystal substrate instead of the Si substrate according to an embodiment disclosed in the above-mentioned JP-A No. 2000-95522.

Second, a reactive ion etching method is not applicable to form the pattern of the resistive element for the bolometer by processing the perovskite type Mn oxide film. In consequence, the physical etching method such as the ion-milling must be used, thus making it difficult to apply the perovskite type Mn oxide thin-film to the material for the bolometer.

SUMMARY OF THE INVENTION

It is therefore an object of this invention to provide a non-cooling infrared ray sensor of a bolometer type with high sensitivity.

It is another object of this invention to provide an oxide thin-film for a bolometer with high TCR and a method for manufacturing an infrared ray sensor using the thin-film.

According to a first aspect of this invention, an oxide for use in a bolometer with an oxide thin-film formed is manufactured on an insulating substrate.

Under this circumstance, metal organic compound is dissolved in solvent to form solution during manufacturing the oxide thin-film.

Then, the solution is applied on the insulating substrate, and the applied solution is dried.

Next, a bond between carbon and oxygen is cut and decomposed by irradiating a laser ray with wavelength of 400 nm or less. Successively, a generated oxide is crystallized.

Here, the oxide thin-film is composed of a perovskite type Mn oxide represented by $A_1-x\ Bx\ Mn\ O_3$ (0<x<1).

Intensity of radiation energy irradiated by measuring electrical resistance of the oxide thin-film is measured by the bolometer. Herein, A is triatomic rare metal, and B is diatomic alkali rare metal.

According to a second aspect of this invention, the earth metal of the perovskite type Mn oxide is at least one selected from the group consisting of La, Nd, and Pr or composite thereof.

According to a third aspect of this invention, the alkali earth metal of the perovskite type Mn oxide is at least one selected from the group consisting of Ca, Sr, and Ba or composite thereof.

According to a fourth aspect of this invention, the laser ray is an excimer laser ray selected from the group consisting of ArF, KrF, XeCl, XeF, and $F_2$.

According to a fifth aspect of this invention, the laser lay is irradiated with multiple stages.

According to a sixth aspect of this invention, the laser ray is irradiated not to completely decompose the metal organic compound at an initial state and to crystallize the perovskite type Mn oxide at a subsequent stage.

According to a seventh aspect of this invention, the irradiation of the laser ray is carried out by heating the insulating substrate applied with the metal organic compound under a temperature 500° C. or less.

According to a eighth aspect of this invention, the insulating substrate is a perovskite type oxide single crystal thin-film selected from the group consisting of $SrTiO_3$, $LaAlO_3$, and $NdGaO_3$.

According to a ninth aspect of this invention, the metal organic compound comprises metal organic acid salt.

According to a tenth aspect of this invention, metal of the metal organic acid salt is at least one selected from the group consisting of La, Nd, Pr, Ca, Sr, Ba, and Mn.

According to a eleventh aspect of this invention, organic acid of the metal organic acid salt is at least one selected from the group consisting of naphthenic acid, 2-ethyl hexanoic acid, caprylic acid, stearic acid, lauric acid, acetic acid, propionic acid, oxalic acid, citric acid, lactic acid, benzonic, salicylic acid, and ethylenediaminetetraacetic acid.

According to a twelfth aspect of this invention, the metal organic compound comprises metal acetylacetonato complex.

According to a thirteenth aspect of this invention, the metal acetylacetonato complex is at least one selected from the group consisting of La, Nd, Pr, Ca, Sr, Ba, and Mn.

According to a fourteenth aspect of this invention, solvent for dissolving the metal acetylacetonato complex is at least one selected from the group consisting of butyl acetate, toluene, acetylacetone, and methanol.

According to a fifteenth aspect of this invention, the perovskite type Mn oxide thin-film formed by the manufacturing method of the first aspect is used as a resistive element for the bolometer in an infrared ray sensor.

According to a sixteenth aspect of this invention, the sensor has a micro-bridge structure.

According to a seventeenth aspect of this invention, the infrared ray sensor is manufactured as follows.

Initially, the resistive element for the bolometer is set on the insulating substrate applied with the metal organic compound. Herein, the resistive element has a pattern portion.

Then, the laser ray with the wavelength of 400 nm or less is irradiated only for the pattern portion through a mask for transmitting the laser ray to form the perovskite type Mn oxide.

Finally, a non-irradiation portion is removed by dissolving using a solvent to directly form a pattern of the resistive element for the bolometer.

According to an eighteenth aspect of this invention, the laser light lay is irradiated with multiple stages such that the pattern of the resistive element for the bolometer is directly formed on the insulating substrate.

According to a nineteenth aspect of this invention, the laser ray is irradiated not to completely decompose the metal organic compound at an initial state and to crystallize the perovskite type Mn oxide at a subsequent stage. Thereby, the pattern of the resistive element for the bolometer is directly formed on the insulating substrate.

According to a twentieth aspect of this invention, the irradiation of the laser ray is carried out by heating the insulating substrate applied with the metal organic compound under a temperature 500° C. or less such that the pattern of the resistive element for the bolometer is directly formed on the insulating substrate.

According to a twenty-first aspect of this invention, the insulating substrate is a perovskite type oxide single crystal thin-film selected from the group consisting of $SrTiO_3$, $LaAlO_3$, and $NdGaO_3$.

According to a twenty-second aspect of this invention, a strong laser ray occurring ablation is initially irradiated on the insulating substrate applied with the metal organic compound through a mask pattern for masking the pattern portion of the resistive element for the bolometer during forming the resistive element for the bolometer.

Then, the mask is removed.

Next, the laser ray with the wavelength of 400 nm or less is irradiated to form directly the perovskite type Mn oxide as the pattern of the resistive element for the bolometer.

According to a twenty-third aspect of this invention, the second laser ray irradiation is carried out by irradiating the laser ray with the wavelength of 400 nm or less with multiple stages. Thereby, the pattern of the resistive element for the bolometer is directly formed on the insulating substrate.

According to a twenty-fourth aspect of this invention, the laser ray is irradiated not to completely decompose the metal organic compound at an initial state and to crystallize the perovskite type Mn oxide at a subsequent stage. Thereby, the pattern of the resistive element for the bolometer is directly formed on the insulating substrate.

According to a twenty-fifth aspect of this invention, the irradiation of the laser ray is carried out by heating the insulating substrate applied with the metal organic compound under a temperature 400° C. or less such that the pattern of the resistive element for the bolometer is directly formed on the insulating substrate.

According to a twenty-sixth aspect of this invention, the insulating substrate is a perovskite type oxide single crystal thin-film selected from the group consisting of $SrTiO_3$, $LaAlO_3$, and $NdGaO_3$.

More specifically, according to this invention, the perovskite type oxide thin-film with the temperature coefficient of the electrical resistance can be deposited at low temperature by the optical reaction using the laser light ray in the method for manufacturing the oxide thin-film for the bolometer and the infrared ray sensor.

DESCRIPTION OF PREFERRED EMBODIMENTS

Figure 1:
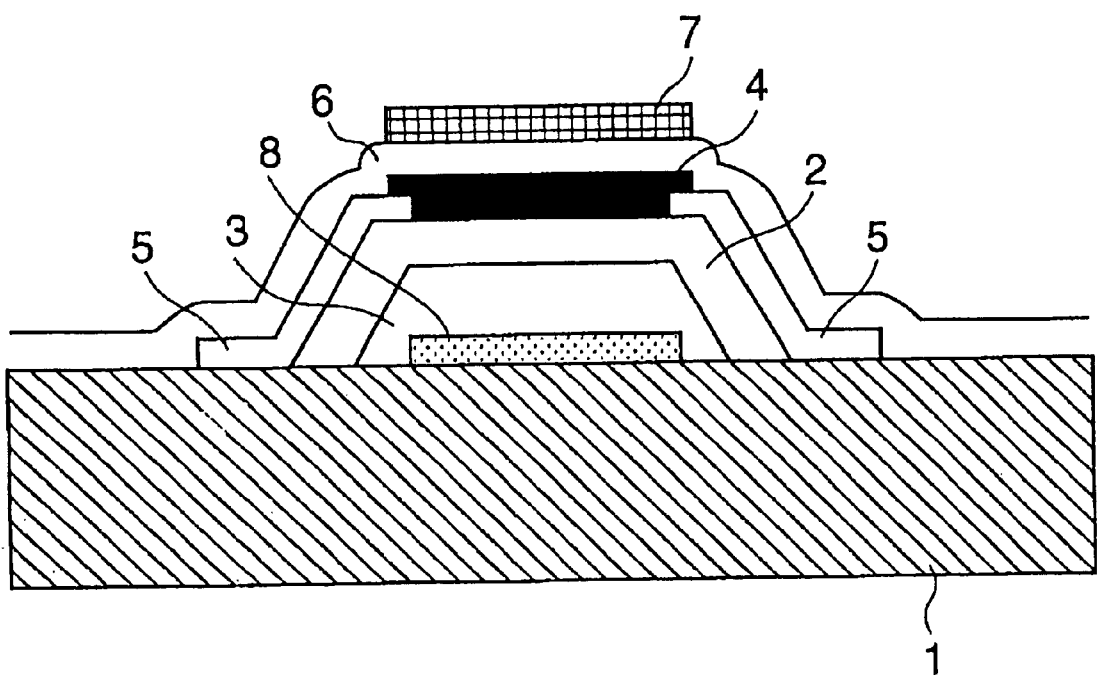
FIG. 1 is a diagram showing an example of an infrared rays sensor using a perovskite type Mn oxide thin-film as a resistive element for a bolometer according to this invention.

Description will be hereinafter made about an oxide thin-film for a bolometer, and a method for manufacturing an infrared ray sensor according to this invention.

In a non-cooling infrared sensor of a bolometer type according to this invention, a temperature is varied by absorbing an incident light ray of an infrared ray. Based upon the temperature variation, an electrical resistance value is changed, thereby reading out a signal with intensity of the incident infrared ray.

Under such a circumstance, a perovskite type Mn oxide represented by $A_1-x\ Bx\ MnO_3$ (0<x<1) is used as a thin-film material for the bolometer in which the electrical resistance value is variable in dependency upon the temperature variation. Herein, A represents triatomic rare earth metal while B indicates diatomic alkali earth metal.

The perovskite type Mn oxide represents a phase transition between an insulator and a metal. In such a phase transition, the perovskite type Mn oxide transfers from an insulating state of high temperature into a metal state of a low temperature near a ferromagnetic transition temperature.

In accordance with the phase transition between the insulator and the metal, the electrical resistance value is largely varied, thus obtaining high TCR.

Such a temperature that the phase transition between the insulator and the metal takes place can be adjusted to the predetermined value by changing combination or composition x of rare earth metal such as La, Nd, and Pr and alkali earth metal such as Ca, Sr, and Ba.

For example, the transition temperature can be set near the room temperature by selecting x within the range between about 0.1 and 0.3 in $La_1-x\ Srx\ MnO_3$.

Further, if a part of Sr is replaced by Ca, the phase transition temperature can be changed, and the electrical resistance is sharply varied in the phase transition, resulting in higher TCR.

According to this invention, a metal organic compound is used during manufacturing the perovskite type Mn oxide thin-film, is dissolved into solvent so as to form solution, and is applied on an insulating substrate, then is dried, and is irradiated with a laser ray with wavelength having 400 nm or less for crystallization, thus forming the resistive element for the bolometer.

In this event, organic group constituting the metal organic compound serves to insulate metal ions to each other by a steric hindrance effect such that particles does not generate by aggregating the metal ions to each other and crystal-growing during forming the oxide thin-film by decomposing after application.

Accordingly, the above organic group can be used as long as the steric hindrance effect appears, As the metal organic compound, metal organic acid salt and organic metal complex compound are exemplified, as described in a paper Japanese Journal of applied Physics 38 volume, L823 page 1999, and 38 volume, L1112 page, 1999. Herein, it is to be noted that these metal organic compounds can be also used as mixture of two kinds or more.

The metal organic acid salt is salt obtained by neutralizing various kinds of metal ions with various kinds of organic salt. As the organic acid, carboxylic acid is preferable, and for example, aliphatic carboxylic acid, alicyclic carboxylic acid, and aromatic carboxylic acid are exemplified.

As the aliphatic carboxylic acid, 2-ethyl hexanoic acid, caprylic acid, stearic acid, lauric acid, acetic acid, propionic acid, oxalic acid, citric acid, lactic acid are exemplified.

As the alicyclic carboxylic acid, for example, naphthenic acid is exemplified. As the aromatic carboxylic acid, benzonic and salicylic acid are exemplified.

La, Nd, Pr, Ca, Sr, Ba, and Mn are used as the metal constituting the metal organic acid salt. In this invention, the metal organic acid salt constituting the perovskite type Mn oxide is used by mixing to the predetermined composition ratio.

The organic metal complex is a compound formed by coordinating the organic group into the metal. Specifically, metal acetylacetonato is exemplified. Herein, the metal acetylacetonato is metal complex formed by combining acetylacetone with metal.

In the metal acetylacetonato, metal acetylacetonato of an objective metal oxide is dissolved in solvent to form solution, and the solution is decomposed to form the metal oxide. The metal acetylacetonato is thus formed, but not limited particularly. For example, acetylacetonato using La, Nd, Pr, Ca, Sr, Ba, and Mn as the metal is exemplified.

According to this invention, the acetylacetonato of the metal constituting the perovskite type Mn oxide and the other metal organic compound are mixed to the predetermined composition ratio for use. The above organic metal compound is dissolved into solvent to form the metal organic compound solution for use. In this event, the kind or used quantity of the solvent is used such that the metal organic compound can be dissolved.

For example, in the case of the metal organic acid salt, the organic solvent is used. The organic solvent can dissolve the metal organic acid salt or the metal acetylacetonato. In this case, each metal organic compound has difference with respect to solubility for the solvent. Consequently, the solvent must be selected to be dissolved uniformly.

For example, as the solvent, hydrocarbon serving as the solvent without polarity such as hexane, octane, benzene, toluene, and tetralin is exemplified.

In addition, use can be made of alcohol such as acetylacetone, methanol and amine, organic acid such as pyridine, acetic acid and propionic acid, and ester such as butyl acetate.

Further, these organic solvents may be combination of one kind or two or more kinds in accordance with the types of the metal acetylacetonato.

When the perovskite type Mn oxide is formed on the insulating substrate by the use of the above organic metal compound, the solution of the organic metal compound is applied onto the substrate, is dried, and then is irradiated with the laser ray with wavelength of 400 nm or less. The thickness of the thin-film formed on the substrate is finally variable within the range between about 0.01 and 10 $\mu$m.

The substrate is set inside a chamber capable of controlling in air or with atmosphere, and is irradiated with the ray having the wavelength of 400 nm or less with the predetermined optical density and repetition number.

As the laser ray, a laser ray having a low heating effect will be used mainly. Such a laser ray comprises an excimer laser ray such as an ultraviolet ray laser XeF (351 nm), XeCl (308 nm), KrF (248 nm), ArF (193 nm), and F2 (157 nm) or an Ar ion laser ray (second higher harmonic wave: 257 nm).

As an example, irradiating conditions using the ArF excimer laser ray is as follows. Namely, the repetition number is equal to 1~20 HZ, the intensity is equal to 10~70 mJ/cm$^2$, and irradiating time is equal to about 3~15 minutes.

Under this circumstance, when the irradiating intensity of the laser ray is too low, crystallization does not occur. In consequence, the effect of the irradiation can not be achieved.

On the other hand, when the intensity is too high, the ablation occurs, thus causing vaporization of the thin-film material. As a result, it is necessary that the irradiation intensity falls within the aforementioned range.

Under such a condition, the excimer laser ray is irradiated onto the substrate. Thereby, a bond between carbon and oxygen of the applied organic metal compound containing metal is cut, is decomposed, and is crystallized, thus forming the perovskite type Mn oxide thin-film at a low temperature between the room temperature and 500° C.

As discussed above, an extremely high temperature of 700° C. or more was necessary in order to produce the perovskite type M oxide thin-film according to the conventional case.

It is possible to produce the perovskite type Mn oxide thin-film at even low temperature between the room temperature and 500° C. by the use of the optical decomposition reaction using the laser irradiation according to this invention.

It is effective to perform the irradiation of the laser ray with a multiple stages, at least two stages. Thereby, the decomposition can be completely carried out by dividing into the multiple stages even when the decomposition can not be accomplished with one stage.

In this case, it is desirable that the initial stage of irradiation is carried out with such weak irradiation that the metal organic compound is not completely decomposed. Then, it is preferable that the strong irradiation is performed so as to crystallize the perovskite type Mn oxide.

Such multiple stages method is particularly effective when the metal organic acid salt is utilized as the metal organic compound.

If the metal organic acid salt is decomposed with the multiple stages, it is possible to stably decompose the metal organic acid salt which is difficult to decompose with the normal one stage. The multiple stage irradiation is considered to be effective from the following reason.

Namely, the metal organic compound can be excited to a quasi-stable state by the use of the weak laser irradiation at the initial stage. From the subsequent stages, the bond between the carbon and the oxygen is cut-out by the strong laser irradiation, so that the decomposition and crystallization to the metal oxide is carried out effectively.

On the other hand, for example, when the laser irradiation is carried out with one stage in the case of a desired kind of metal organic acid salt, the metal organic acid salt molecular is readily vaporized, and thereby the oxide thin-film can not be often obtained.

In the two stage irradiation, for example, the ArF excimer late is used. Under such a circumstance, the initial irradiation is carried out with 10 mJ/cm$^2$ and 50 Hz for 30 seconds, and successively, the second irradiation is performed with 50 mJ/cm$^2$ and 10 Hz for 5 minutes.

During irradiating the laser ray, the insulating substrate applied with the metal organic compound is heated to the temperature of 400° C. or less. Thereby, the crystallinity of the perovskite type Mn oxide thin-film can be further improved compared to the case of the irradiation at the room temperature. As a result, TCR is more increased at the phase transition temperature between the insulator and the metal.

Further, use is made of an oxide single crystal thin-film such as $SrTiO_3$, $LaAlO_3$, and $NdGaO_3$ as the insulating substrate applied with the metal organic compound during the irradiating the laser ray, thus more increasing TCR under the phase transition temperature between the insulator and the metal.

Lattice mismatch between the perovskite type Mn oxide and oxides thereof excessively becomes small, so that the Mn oxide thin-film epitaxially grows on these substrates. To this end, an affect of a grain boundary becomes small, thus obtaining the thin-film with electrically high quality.

Subsequently, description will been hereinafter made about the structure of the infrared sensor using the above perovskite type Mn oxide thin-film as the resistive element for the bolometer with reference to FIG. 1.

Referring to FIG. 1, the reference number 1 represents a Si substrate, the reference number 2 represents a bridge structure body, the reference number 3 represents a space, the reference 4 represents a resistive element for the bolometer, the reference number 5 represents a wiring pattern, the reference number 6 represents a protection film, the reference number 7 represent an infrared absorption film, and the reference number 8 represents the infrared reflection film. As illustrated in FIG. 1, the infrared sensor according to this invention has a micro-bridge structure.

More specifically, the resistive element 4 for the bolometer is thermally isolated from the silicon substrate 1 via the space 3. As the resistive element 4 for the bolometer, use will be made of the perovskite type Mn oxide thin-film produced by the use of the above-discussed production method.

With this structure, the incident infrared ray or the infrared ray that is partially reflected by the infrared ray reflection film 8 is absorbed by the infrared ray absorption layer 7, and the temperature varied depending on it is converted into the electrical resistance variation of the perovskite type Mn oxide.

Further, the signal is detected by the wiring pattern 5 connected from the both ends of the resistive element 4 for the bolometer to the substrate 1 through the supporting legs of the bridge structure body 2.

As illustrated in FIG. 1, the resistive element 4 for the bolometer is formed in the Si substrate. In consequence, it must be prevented from reaching the temperature of 500° C. or higher during depositing the film from the viewpoint of a problem such as reaction.

The perovskite type Mn oxide thin-film is manufactured by the use of the above-described method, so that the thin-film can be formed under the low deposition temperature of 500° C. or lower for the structure illustrated in FIG. 1.

Although such a structure could not be readily formed by using the perovskite type Mn oxide thin-film indicative of the excellent phase transition between the insulator and the metal in the conventional case, it can be easily formed according to this invention.

During forming the above resistive element 4 for the bolometer, the laser ray with wavelength of 400 nm or less is initially irradiated via a mask for transmitting through only a pattern portion of the resistive element for the bolometer on which the metal organic compound is set on the applied insulating substrate.

As a result, only a part of the resistive element 4 for the bolometer irradiated with the laser ray is crystallized into the perovskite type Mn oxide.

On the other hand, the remaining part except for the resistive element 4 for the bolometer is masked by the mask. Consequently, the laser ray is not irradiated, thus remaining in the state of the metal organic compound itself.

Accordingly, when the mask is removed to perform washing process by the use of organic solvent after irradiating the laser ray, a non-irradiating portion is dissolved and selectively removed.

However, a portion serving as the perovskite type Mn oxide is not dissolved into the organic solvent. Thereby, the resistive element 4 for the bolometer can be directly formed on the bridge structure body 2 faithfully for the mask pattern.

In the conventional method for forming the resistive element for the bolometer using vanadium oxide base, the thin-film was manufactured by the sputtering method, was applied with a resist by a spin coater, and then was dried and developed.

Further, the etching was carried out by the use of the reactive ion etching, and the resist was removed. Thus, a great number of steps were necessary in the conventional case.

By contrast the production process for the resistive element 4 for the bolometer of the infrared sensor will be largely shortened according to this invention.

During forming the resistive element 4 for the bolometer by the laser ray irradiation, it is effective that the laser ray irradiation is carried out with multiple stages, at least two stages.

More specifically it is desirable that the initial stage irradiation is performed under such weak irradiation that the metal organic compound is not decomposed completely, and then strong irradiation is carried out so as to be crystallized to the perovskite type Mn oxide.

Moreover, when the laser ray is irradiated under such condition that the insulating substrate applied with the metal organic compound is heated at the temperature of 500° C. or lower, TCR of the resistive element 4 for the bolometer can be increased in comparison with the case of the irradiation under the room temperature.

Further, use is made of the oxide single crystal thin-film such as $SrTiO_3$, $LaAlO_3$, and $NdGaO_3$ as the insulating substrate applied with the metal organic compound, thus more increasing TCR of the resistive element 4 for the bolometer.

Subsequently, description will be made about another method for forming the resistive element 4 for the bolometer.

Initially, a strong laser ray occurring ablation is irradiated for the insulating substrate applied with the metal organic compound through a mask for masking a pattern portion of the resistive element 4 for the bolometer. Thereby, the metal organic compound of the portion except for the resistive element 4 for the bolometer will be removed by ablation.

In the meantime, no variation does not occur for the metal organic compound of the pattern portion of the resistive element 4 in this stage.

Then, when the mask is removed and the laser ray with the wavelength of 400 nm or less is irradiated, the organic metal compound of the portion of the resistive element 4 for the bolometer is crystallized into the perovskite type Mn oxide. Thereby, the resistive element 4 for the bolometer can be formed directly.

Accordingly, the process due to organic solvent after irradiating the laser ray required in the aforementioned production method will be omitted by using such a method.

When the resistive element 4 for the bolometer is formed by the second laser ray irradiation, it is effective that the laser light ray irradiation is carried out with multiple stages, at least two stages.

More specifically, it is preferable that the initial stage irradiation is performed with such weak irradiation that the metal organic compound is not decomposed completely, and then strong irradiation is carried out so as to be crystallized into the perovskite type Mn oxide.

Further, if the laser ray is irradiated in such a condition that the insulating substrate applied with the metal organic compound is heated to the temperature of 500° C. or less, the TCR of the resistive element 4 for the bolometer can be made higher than the case of the irradiation at the room temperature.

In addition, use is made of the oxide single crystal thin-film such as $SrTiO_3$, $LaAlO_3$, and $NdGaO_3$ as the insulating substrate applied with the metal organic compound, thus increasing more TCR of the resistive element 4 for the bolometer.

EXAMPLES

Detail explanation will be hereinafter made about a method for manufacturing the oxide thin-film for the bolometer and the infrared ray sensor according to this invention with several examples. However, this invention is not restricted to the examples.

First Example

Naphtheinic acid La solution of metal organic base, naphtheinic acid Sr solution, and naphtheinic acid Mn solution were used as the metal organic compound, and were dissolved into toluene such that the ratio of La, Sr, and Mn was equal to 0.8:0.2:1.

In this event, a (100) Si substrate, on which a thermal oxide film ($SiO_2$) was formed to about 0.2 $\mu$m on the surface, was used as the substrate. The raw material was spin-coated on the substrate, and then was dried at 200° C. for 10 minutes. This step was repeated five times.

Successively, the ArF excimer laser ray was irradiated with 10 $mJ/cm^2$ and 50 H for 30 seconds, further with 50 $mJ/cm^2$ and 10 Hz for 5 minutes in air at the room temperature.

Figure 2:
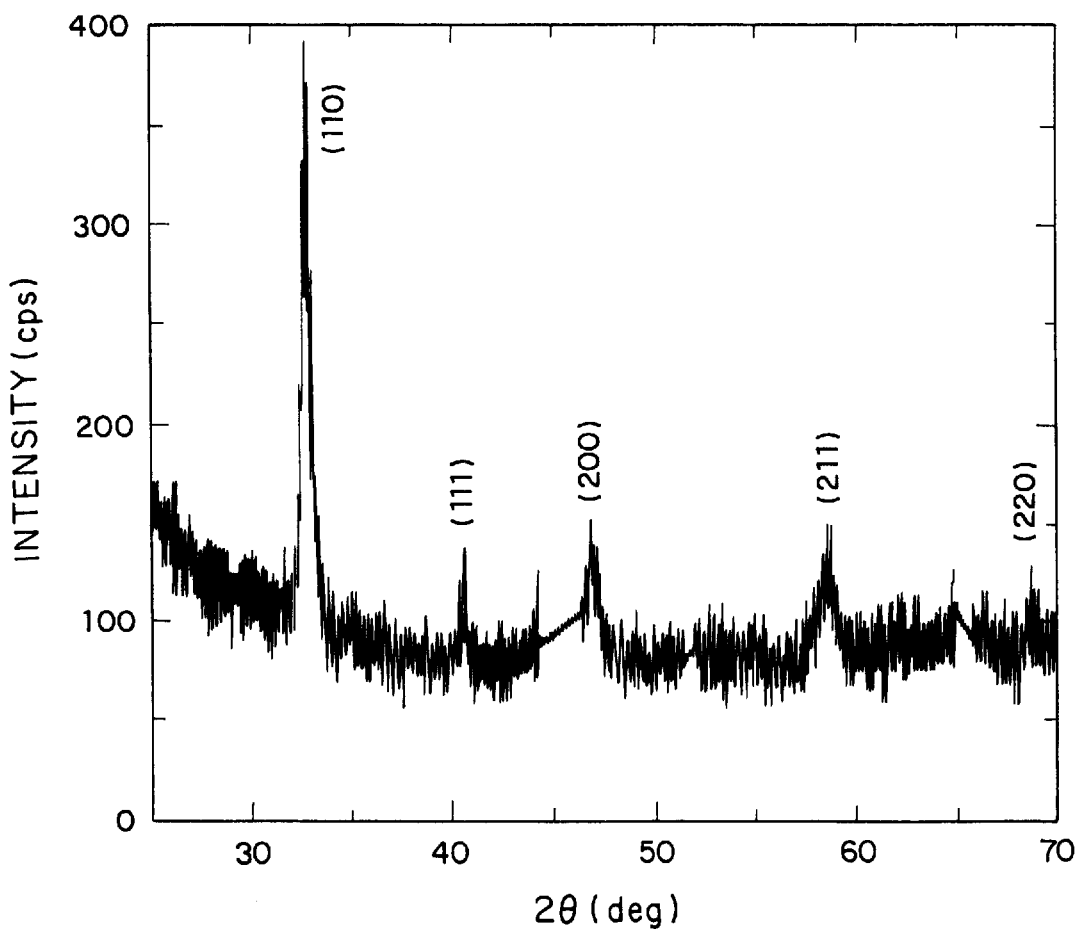
FIG. 2 is a diagram showing a measuring result due to an X ray diffraction of perovskite type Mn oxide thin-film according to this invention.

The structure of the obtained thin-film was estimated by the use of the X-ray diffraction method. As a result, it was found out that only the diffraction peak corresponding to the structure of the perovskite type Mn oxide was observed as illustrated in FIG. 2, and a desired thin-film could be obtained even at the room temperate by the laser ray irradiation with the wavelength of 400 nm or less according to this invention.

Further, the temperature variation of the electrical resistance of the thin-film was measured by the four-probe method. In consequence, large variation of the electrical resistance caused by the phase transition between the insulator and the metal inherent to the perovskite type Mn oxide was observed near 300 K. With such phase transition, high TCR of about 8%/K could be obtained.

This value was excessively high as compared to the TCR of about 2~4%/K observed for the conventional Mn based thin-film using the vanadium based thin-film or the semiconductor region.

Moreover, the electrical resistivity was equal to about 1 $\Omega$cm near this temperature, and fell within the range of the electrical resistivity required for the material for the bolometer. Thus, the perovskite type Mn oxide with high TCR could be formed at the lower temperature by using the production method according to this invention.

As a result, it was confirmed that the production method matched with the Si production process, and was very excellent as the production method of manufacturing the resistive material for the bolometer.

In this event, when the ArF excimer laser ray was irradiated with intensity of 10 $mJ/cm^2$ and 10 Hz for 5 minutes, the intensity of the light ray was weak and was not crystallized. Consequently, the perovskite type Mn oxide could not be obtained.

On the other hand, in the case where the irradiation was carried out with intensity of 100 $mJ/cm^2$ for 1 minute, the ablation took place, and the metal organic compound was not remained on the substrate after the irradiation.

Thus, it is necessary that the intensity of the irradiated laser ray fall within the optimum range in the method for manufacturing the perovskite type Mn oxide thin-film according to this invention.

Herein, it should be noted that the intensity of the optimum laser ray is naturally variable in dependency upon the combination of the metal or the type of the metal organic compound.

Second Example

According to the second example, use was made of acetylacetonato La solution, acetylacetonato Sr solution, acetylacetonato Ca solution, and acetylacetonato Mn solution as the metal organic compound, and was dissolved into butyle acetate such that the ratio of La, Sr, Ca, and Mn was equal to 0.7:0.1:0.2:1.

Further, use was made of the (100) Si substrate with the thermal oxide film ($SiO_2$) of about 0.2 $\mu$m on the same surface as the first example and the Si substrate with $SrTiO_3$ epitaxial thin-film via the buffer layer as the substrate. Here, the thickness of the $SrTiO_3$ thin-film was about 50 nm.

The above raw solution was spin-coated on the substrate, and was dried at 200° C. for 10 minutes. This step was repeated ten times for both substrates.

These substrates were arranged on the hot plate heated to 250° C. Under such a condition, the ArF excimer laser ray was irradiated with 10 $mJ/cm^2$ and 50 Hz for 30 seconds, successively with 50 $mJ/cm^2$ and 10 Hz for 5 minutes in air at the room temperature.

The structure of the obtained thin-film was estimated by the use of the X-ray diffraction method. As a result, it was found out that only the diffraction peak corresponding to the structure of the perovskite type Mn oxide was observed in both thin-films.

In this case, the Mn thin-film on the Si thermal oxide film did not have orientation as shown in FIG. 2, and the thin-film was polycrystalline. However, a sharper X-ray diffraction peak than the first example was obtained by heating the substrate temperature to 250° C. during irradiating the laser ray.

In the meantime, only a (200) diffraction peak was observed in almost the same position as the substrate in the perovskite type Mn oxide formed on the $SrTiO_3$ thin-film, and the epitaxial growth was carried out.

When the temperature variation of the electrical resistance of these thin-films was measured by the use of the four probe method, the large variation of the electrical resistance caused by the phase transition between the insulator and the metal inherent to the perovskite type Mn oxide was observed near the room temperature like the first example.

As the TCR, high values were obtained. Specifically, the TCR was equal to 11% in the Mn based thin-film on the Si thermal oxide film while the TCR was equal to about 13% in the Mn based thin-film on the $SrTiO_3$ epitaxial thin-film.

Moreover, the electrical resistivity was equal to 1 $\Omega$cm near this temperature, and fell within the range of the electrical resistivity required for the material for the bolometer.

Third Example

The infrared ray sensor was manufactured by the following method by using the aforementioned perovskite type Mn oxide thin-film as the resistive element for the bolometer.

Metal with high infrared reflection ratio such as WSi was deposited on the Si substrate 1 with the reading-out circuit by the sputtering method to thereby form the infrared ray reflection film 8. A sacrifice layer such as a polysilicon layer was formed at the position where would serve as the space 3 on the infrared ray reflection film 8.

An insulating film such as SiN and $SiO_2$ was deposited on the sacrifice layer by the plasma CVD method, thus serving the portion as the bridge structure body 2. Then, metal with low thermal conductivity such as Ti was formed on the bridge structure body 2 by the sputtering method, was exposed, developed, and was etched to form the wiring pattern 5.

Next, use was made of naphthenic acid Pr solution, naphthenic acid Sr solution, and naphthenic acid Mn solution as the metal organic compound, and was dissolved into toluene such that the ratio of Pr, Sr, and Mn was equal to 0.8:0.2:1 to prepare solution thereof. The solution was spin-coated on the bridge structure body 2, and then was dried at 200° C. for 10 minutes. This step was repeated ten times.

Successively, a mask with a shape for transmitting the laser ray having the wavelength of 400 nm or less through the pattern portion of the resistive element 4 for the bolometer was set on the bridge structure body 2.

In such a state, the ArF excimer laser ray was irradiated with 10 $mJ/cm^2$ and 50 Hz for 30 seconds, further with 50 $mJ/cm^2$ and 10 Hz for 5 minutes in air at the room temperature.

As a result, the pattern portion of the resistive element 4 for the bolometer irradiated by the laser light ray was crystallized into the perovskite type Mn oxide. While, no variation occurred for the other portion, which was not irradiated by the laser ray, thus keeping to the state of the metal organic compound.

In this stage, when washing was carried out, the non-irradiation portion was dissolved and selectively removed, so that the perovskite type Mn oxide was left for the portion of the resistive element 4 for the bolometer.

Successively, the insulating film such as SiN and $SiO_2$ was deposited on the resistive element 4 for the bolometer by the use of the plasma CVD method to thereby form the protection film 6. The absorption layer 7 such as TiN was formed on the protection film 6 by the reactive sputtering method. Thereafter, the sacrifice layer was wet-etched by hydrazine to thereby form the space 3. By the aforementioned method, a diaphragm having a floating structure was formed.

The principle for operating as the infrared ray sensor will be explained as follows.

When the infrared ray was incident to a cell, a part of the incident light ray was absorbed by the infrared ray absorption film 7, and a partially transmitted infrared ray was reflected by the infrared ray reflection film 8. In consequence, the incident infrared ray was completely absorbed by the infrared ray absorption film 7.

The absorbed infrared ray generated heat, and heated the diaphragm, so that the electrical resistance of the resistive element 4 for the bolometer was varied. The temperature resolution NETD of thus-produced infrared ray sensor could be reduced to ⅓ or less as compared to the infrared ray sensor using the conventional vanadium oxide base thin-film as the resistive element 4 for the bolometer.

Fourth Example

The infrared ray sensor was manufactured using the perovskite type Mn oxide thin-film as the resistive element 4 for the bolometer by the method different from the third example.

Initially, metal with high infrared reflection ratio such as WSi was deposited on the Si substrate 1 with the reading-out circuit by the sputtering method to thereby form the infrared ray reflection film 8. A sacrifice layer such as a polysilicon layer was formed at the position where would serve as the space 3 on the infrared ray reflection film 8.

An insulating film such as SiN and $SiO_2$ was deposited on the sacrifice layer by the plasma CVD method, thus serving the portion as the bridge structure body 2. Then, metal with low thermal conductivity such as Ti was formed on the bridge structure body 2 by the sputtering method, exposed, developed, and etched to form the wiring pattern 5.

Next, use was made of acetylacetonato acid Nd solution, acetylacetonato acid Sr solution, acetylacetonato acid Ba solution, and acetylacetonato acid Mn solution as the metal organic compound, and was dissolved into butyl acetate such that the ratio of Nd, Sr, Ba, and Mn was equal to 0.8:0.18:0.02:1 to prepare solution thereof.

The solution was spin-coated on the bridge structure body 2, and then was dried at 200° C. for 10 minutes. This step was repeated ten times.

Subsequently, the pattern portion was masked on the bridge structure body 2, a mask for transmitting the laser light ray was arranged for the other portion, and a laser ray with a relatively strong intensity of 500 $mJ/cm^2$ was irradiated for 3 minutes.

As a result, the laser ray was irradiated except for the pattern portion of the resistive element 4. Thereby, the organic metal compound was ablated and removed.

Next, the mask was removed, and the ArF excimer laser ray was irradiated with 10 $mJ/cm^2$ and 50 Hz for 30 seconds, further with 50 $mJ/cm^2$ and 10 Hz for 5 minutes in air at the room temperature. As a result, the pattern portion of the resistive element 4 for the bolometer irradiated by the second laser ray was crystallized into the perovskite type Mn oxide.

Successively, the insulating film such as SiN and $SiO_2$ was deposited on the resistive element 4 for the bolometer by the use of the plasma CVD method to thereby form the protection film 6. The absorption layer 7 such as TiN was formed on the protection film 6 by the reactive sputtering method. Thereafter, the sacrifice layer was wet-etched by hydrazine to thereby form the space 3. By the aforementioned method, a diaphragm having a floating structure was formed.

The temperature resolution NETD of thus-produced infrared ray sensor could be reduced to ⅓ or less as compared to the infrared ray sensor using the conventional vanadium oxide base thin-film as the resistive element 4 for the bolometer.

In the case where the same resistive element 4 for the bolometer is used, NETD becomes high if a cell area is reduced. Namely, the temperature resolution of the infrared ray sensor is degraded.

However, TCR becomes extremely high when the perovskite type Mn oxide thin-film is used according to this invention. Thereby, NETD can be kept to the conventional level or less. To this end, this invention is applicable for the multiple pixels for the infrared ray sensor.

While this invention has thus far been disclosed in conjunction with several embodiments thereof, it will be readily possible for those skilled in the art to put this invention into practice in various other manners.

What is claimed is:

1. A method for manufacturing an oxide for use in a bolometer with an oxide thin-film formed on an insulating substrate, comprising the steps of:

dissolving metal organic compound in solvent to form solution during manufacturing the oxide thin-film;

applying the solution on the insulating substrate;

drying the applied solution;

cutting and decomposing a bond between carbon and oxygen by irradiating a laser ray with wavelength of 400 nm or less; and crystallizing a generated oxide, the oxide thin-film being composed of a perovskite type Mn oxide represented by $A_1-x\ Bx\ Mn\ O_3$ (0<x<1), and intensity of radiation energy irradiated by measuring electrical resistance of the oxide thin-film being measured by the bolometer, wherein A is triatomic rare metal, and B is diatomic alkali rare metal.

2. A method as claimed in claim 1, wherein:

the earth metal of the perovskite type Mn oxide is at least one selected from the group consisting of La, Nd, and Pr or composite thereof.

3. A method as claimed in claim 1, wherein:

the alkali earth metal of the perovskite type Mn oxide is at least one selected from the group consisting of Ca, Sr, and Ba or composite thereof.

4. A method as claimed in claim 1, wherein:

the laser ray is an excimer laser ray selected from the group consisting of ArF, KxF, XeCl, XeF, and $F_2$.

5. A method as claimed in claim 1, wherein:

the laser lay is irradiated with multiple stages.

6. A method as claimed in claim 5, wherein:

the laser ray is irradiated not to completely decompose the metal organic compound at an initial state and to crystallize the perovskite type Mn oxide at a subsequent stage.

7. A method as claimed in claim 1, wherein:

the irradiation of the laser ray is carried out by heating the insulating substrate applied with the metal organic compound under a temperature 500° C. or less.

8. A method as claimed in claim 1, wherein:

the insulating substrate is a perovskite type oxide single crystal thin-film selected from the group consisting of $SrTiO_3$, $LaAlO_3$, and $NdGaO_3$.

9. A method as claimed in claim 1 wherein:

the metal organic compound comprises metal organic acid salt.

10. A method as claimed in claim 9, wherein:

metal of the metal organic acid salt is at least one selected from the group consisting of La, Nd, Pr, Ca, Sr, Ba, and Mn.

11. A method as claimed in claim 9, wherein:

organic acid of the metal organic acid salt is at least one selected from the group consisting of naphthenic acid, 2-ethyl hexanoic acid, caprylic acid, stearic acid, lauric acid, acetic acid, propionic acid, oxalic acid, citric acid, lactic acid, benzonic, salicylic acid, and ethylenediaminetetraacetic acid.

12. A method as claimed in claim 1, wherein:

the metal organic compound comprises metal acetylacetonato complex.

13. A method as claimed in claim 12, wherein:

the metal acetylacetonato complex is at least one selected from the group consisting of La, Nd, Pr, Ca, Sr, Ba, and Mn.

14. A method as claimed in claim 12, wherein:

solvent for dissolving the metal acetylacetonato complex is at least one selected from the group consisting of butyl acetate, toluene, acetylacetone, and methanol.

15. An infrared ray sensor, wherein:

the perovskite type Mn oxide thin-film formed by the manufacturing method claimed in claim 1 is used as a resistive element for the bolometer.

16. An infrared ray sensor as claimed in claim 15, wherein:

the sensor has a micro-bridge structure.

17. A method for manufacturing the infrared ray sensor claimed in claim 15, comprising the steps of:

setting the resistive element for the bolometer on the insulating substrate applied with the metal organic compound, the resistive element having a pattern portion;

irradiating the laser ray with the wavelength of 400 nm or less only for the pattern portion through a mask for transmitting the laser ray to form the perovskite type Mn oxide;

removing a non-irradiation portion by dissolving using a solvent to directly form a pattern of the resistive element for the bolometer.

18. A method as claimed in claim 17, wherein:

the laser light lay is irradiated with multiple stages such that the pattern of the resistive element for the bolometer is directly formed on the insulating substrate.

19. A method as claimed in claim 18, wherein:

the laser ray is irradiated not to completely decompose the metal organic compound at an initial state and to crystallize the perovskite type Mn oxide at a subsequent stage, whereby the pattern of the resistive element for the bolometer is directly formed on the insulating substrate.

20. A method as claimed in claim 17, wherein:

the irradiation of the laser ray is carried out by heating the insulating substrate applied with the metal organic compound under a temperature 500° C. or less such that the pattern of the resistive element for the bolometer is directly formed on the insulating substrate.

21. A method as claimed in claim 17, wherein:

the insulating substrate is a perovskite type oxide single crystal thin-film selected from the group consisting of $SrTiO_3$, $LaAlO_3$, and $NdGaO_3$.

22. A method as claimed in claim 17, wherein a strong laser ray occurring ablation is initially irradiated on the insulating substrate applied with the metal organic compound through a mask pattern for masking the pattern portion of the resistive element for the bolometer during forming the resistive element for the bolometer, the mask is removed, and the laser ray with the wavelength of 400 nm or less is irradiated to form directly the perovskite type Mn oxide as the pattern of the resistive element for the bolometer.

23. A method as claimed in claim 22, wherein:

the second laser ray irradiation is carried out by irradiating the laser ray with the wavelength of 400 nm or less with multiple stages, whereby the pattern of the resistive element for the bolometer is directly formed on the insulating substrate.

24. A method as claimed in claim 22, wherein:

the laser ray is irradiated not to completely decompose the metal organic compound at an initial state and to crystallize the perovskite type Mn oxide at a subsequent stage, whereby the pattern of the resistive element for the bolometer is directly formed on the insulating substrate.

25. A method as claimed in claim 2, wherein:

the irradiation of the laser ray is carried out by heating the insulating substrate applied with the metal organic compound under a temperature 400° C. or less such that the pattern of the resistive element for the bolometer is directly formed on the insulating substrate.

26. A method as claimed in claim 22, wherein:

the insulating substrate is a perovskite type oxide single crystal thin-film selected from the group consisting of $SrTiO_3$, $LaAlO_3$, and $NdGaO_3$.

* * * * *